(12) United States Patent
Nakatsukasa et al.

(10) Patent No.: US 7,437,834 B2
(45) Date of Patent: Oct. 21, 2008

(54) METHOD OF PROCESSING SUBSTRATE AND SUBSTRATE PROCESSING APPARATUS

(75) Inventors: Katsuyoshi Nakatsukasa, Okayama (JP); Kazuhisa Ogasawara, Okayama (JP); Yoshiaki Sakaihara, Okayama (JP); Yoshihiro Haruki, Okayama (JP); Munenori Kawate, Okayama (JP)

(73) Assignee: S.E.S. Co., Ltd., Tokyo (JP)

( * ) Notice: Subject to any disclaimer, the term of this patent is extended or adjusted under 35 U.S.C. 154(b) by 119 days.

(21) Appl. No.: 10/567,792

(22) PCT Filed: Dec. 2, 2003

(86) PCT No.: PCT/JP03/15431

§ 371 (c)(1),
(2), (4) Date: Feb. 9, 2006

(87) PCT Pub. No.: WO2005/015625

PCT Pub. Date: Feb. 17, 2005

(65) Prior Publication Data

US 2006/0201363 A1    Sep. 14, 2006

(30) Foreign Application Priority Data

Aug. 12, 2003  (JP) ............................. 2003-292523

(51) Int. Cl.
*F26B 7/00*  (2006.01)
(52) U.S. Cl. ............................................. 34/381; 34/90
(58) Field of Classification Search ............... 34/381, 34/467, 77, 78, 80, 86, 90; 134/95.2, 902
See application file for complete search history.

(56) References Cited

U.S. PATENT DOCUMENTS 5,950,328 A * 9/1999 Ichiko et al. .................. 34/364
6,244,575 B1 * 6/2001 Vaartstra et al. ............. 261/141

FOREIGN PATENT DOCUMENTS

| JP | 10-118586   | 5/1998  |
| JP | 11-191549   | 7/1999  |
| JP | 2000-55543  | 2/2000  |
| JP | 2002-134461 | 5/2002  |
| JP | 2002-359221 | 12/2002 |

* cited by examiner

*Primary Examiner*—S. Gravini
(74) *Attorney, Agent, or Firm*—Westerman, Hattori, Daniels & Adrian, LLP.

(57) ABSTRACT

A substrate processing apparatus 10 including a vapor generating unit $37_1$ which generates a mixed gas consisting of an organic solvent vapor and an inert gas by bubbling the inert gas in the organic solvent; support means for supporting a plurality of substrates to be vertically arranged in parallel at equal pitches; a processing vessel 15 which accommodates multiple substrates supported by the support means; a lid 30 for covering the upper opening of the processing vessel; jet nozzles 33 provided in the lid 30; and first piping $37_{12}$, $34_2$, $34_{21}$, and $34_{22}$ which causes the vapor generating unit and the jet nozzles to communicate with each other. In the substrate processing apparatus 10, the first piping and the jet nozzles are respectively equipped with heaters, and the heaters are controlled by means of dry gas containing organic solvent mists of submicron size being emitted from the jet nozzles. According to the invention, Since micro-size organic solvent vapor is used, the substrate processing method and apparatus of the invention ensures not only high-quality surface processing but also the reduction of processing time.

7 Claims, 11 Drawing Sheets

F I G. 6
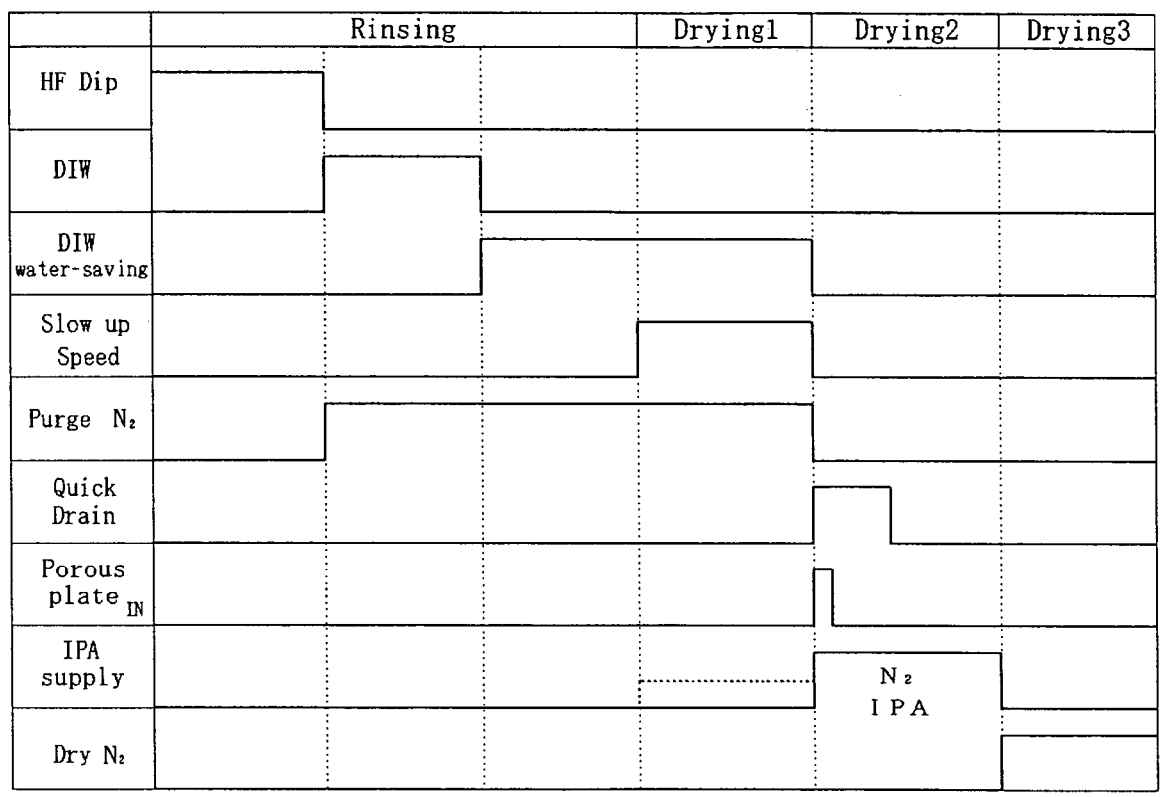

F I G. 1 0
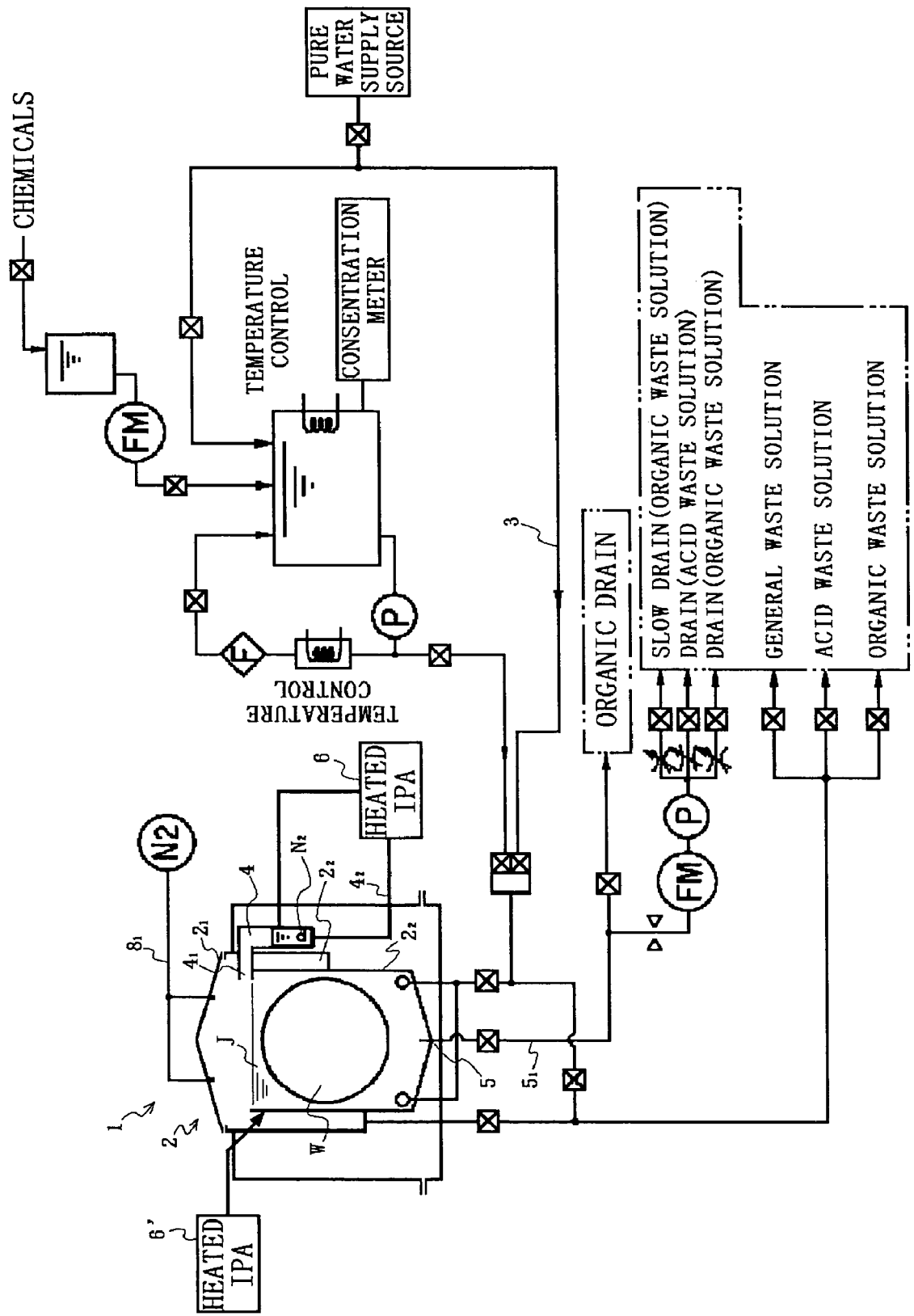

METHOD OF PROCESSING SUBSTRATE AND SUBSTRATE PROCESSING APPARATUS

TECHNICAL FIELD

The present invention relates to a substrate processing method and a substrate processing apparatus designed to perform drying processing on substrate surfaces such as a semiconductor wafer, a liquid crystal display device substrate, a recording disk substrate, and a mask substrate most efficiently and with a high degree of quality.

BACKGROUND ART

In the process of cleaning the surface of various substrates, for example, a semiconductor wafer (hereinafter referred to as wafer), is cleaned by applying chemicals to the surface thereof, and then rinsed with a processing solution such as pure water, and thereafter dried with an organic solvent such as isopropyl alcohol (hereinafter referred to as IPA). More specifically, the processing includes a process, in which, after it has been cleansed with chemicals and pure water, the wafer is exposed to IPA vapor to condense IPA on the wafer surface to substitute the IPA adhering to the wafer with pure water, and certain contaminants such as particles are washed out from the wafer surface, and a drying process by which IPA is vaporized to dry the wafer surface. In the drying process, even the smallest water droplet remaining on the wafer surface can form a water mark on the wafer surface, thereby adversely affecting the quality of the wafer. Therefore, in the semiconductor production process, it is necessary to ensure that contaminants do not adhere to the wafer. Various methods and apparatuses for processing substrate surfaces of wafers and the like, including measures dealing with contaminants, have been devised and put to practical use, and such method and apparatus for processing the substrate have been disclosed in several patent documents, including Japanese Laid-Open Patent No. 2001-271188 (see FIG. 1 and left column of page 5 to left column of page 6) and Japanese Laid-Open Patent No. H11-191549 (see claims, paragraph No. 0018 to paragraph [0024], and FIG. 1).

Hereafter, the substrate processing apparatus disclosed in Japanese Laid-Open Patent No. 2001-271188 will be described with reference to FIGS. 10 and 11. FIG. 10 is a sectional view of the substrate processing apparatus described in Japanese Laid-Open Patent No. 2001-271188. A substrate processing apparatus 1 comprising a processing vessel 2, a processing solution introducing pipe 3, a vapor generation unit 4, a processing solution drain unit 5, and heated-solvent supply devices 6 and 6'. The processing vessel 2 houses the substrates (for example, wafer) to be processed. The processing solution introducing pipe 3 supplies the processing solution (for example, pure water) into the processing vessel 2. The vapor generation unit 4 houses the organic solvent solution (for example, IPA). The processing solution drain unit 5 drains the processing solution from the processing vessel 2. The heated-solvent supply devices 6 and 6' supply the heated organic solvent into the vapor generation unit 4. The plural substrates are conveyed into the processing vessel 2 while vertically standing in parallel at equal intervals, and substrate surface processing is performed.

In the substrate processing apparatus 1, the surface processing of various substrates, e.g., a semiconductor wafer W (hereinafter referred to as wafer W) is performed in accordance with the following processes.

1) Wafer Conveying Process

A lid $2_1$ of the processing vessel 2 for keeping pure water J in a standby state in the processing apparatus 1 is opened, and the plural wafers W are conveyed to an inner vessel $2_2$ of the processing vessel 2, and thrown and dipped into the pure water J, and the lid $2_1$ is closed. Then, an inert gas such as a nitrogen gas is supplied from an inert gas supply pipe $8_1$ into the processing vessel 2, to replace air in the processing vessel 2.

2) Drying Process

Then, after the wafer W is washed or rinsed, bubbling nitrogen gas $N_2$ is supplied to the vapor generation unit 4 to generate vapor of an organic solvent solution, e.g., IPA, and the vapor generated is conveyed from the vapor discharge port $4_1$ to the processing vessel 2, and the space above the pure water J therein is filled with the vapor.

Then, the on-off valve of an inner-vessel drain pipe $5_1$ is opened to drain the pure water J in the inner vessel $2_2$ bit by bit through a flow control valve, and the liquid level of the pure water J gradually decreases to expose the wafer W from the upper end thereof to the liquid surface of the pure water J.

When the surface of wafer W is exposed while lying above the liquid surface of the pure water J, the IPA vapor in the processing vessel 2 comes into contact with the surface of wafer W. At this point, because the pure water J of the processing vessel 2 is substantially set at room temperature, the temperature of the wafer W nearly reaches room temperature also. Therefore, by coming into contact with the wafer W, the IPA vapor is rapidly cooled and condenses on the surface of the wafer W on the liquid surface. The condensed IPA reduces surface tension of the pure water and acts to replace the pure water that has adhered to the wafer W. After the pure water J is completely drained, inert gas is supplied to the processing vessel 2 from the inter gas supply pipe $8_1$ in order to dry the surface of the wafer W by causing the IPA to evaporate.

3) Wafer Taking Out Process

Then, after the pure water J is drained from the inner vessel $2_2$, the substrate processing is completed by taking out the wafer W from the processing vessel 2 upon opening the lid $2_1$.

In the substrate processing apparatus 1, since the series of processes is performed in one closed processing vessel, the wafer never comes into contact with the atmosphere, and the adhesion of contaminants such as foreign particles and water marks as well to the wafer surface can be avoided while ensuring efficient processing thereof.

However, in recent years, it has become necessary to insert into the processing vessel wafers processed by this kind of substrate processing apparatus in large numbers as may be possible in order to increase processing efficiency. In some cases, the wafers are simultaneously processed in the processing vessel in lot units ranging from 50 to 100 wafers, so that the space between wafers tends to become smaller. In addition, the diameter of wafers has increased from 200 mm to 300 mm. Accordingly, while the generation of water marks can be suppressed in wafers of relatively small diameter, such as 200 mm or less, such is not the case for wafers having a diameter of as large as 300 mm. The processing efficiency of the conventional apparatus is therefore limited.

By examining water marks formed from various angles, the inventors discovered that since the IPA vapor in dry gas is obtained by bubbling the inert gas in IPA, it contains a large amount of liquid particles of micro IPA (hereinafter referred to as "mist") other than IPA gas with lower saturation concentration, and the size and mass of the mist is larger than those of nitrogen gas. Therefore, the IPA mist hardly passes through the narrow gaps between wafers. Accordingly, when the diameter of the wafer becomes 300 mm, IPA substitution is not sufficiently performed because the IPA mist is hardly supplied to the wafer surface which is far from a supply port of the IPA mist. In other words, in cases involving the same total amount of IPA contained in the dry gas, the number of mists decreases as the size of the IPA mist increases. Conversely, the number of mists increases as the size of the IPA mist decreases. Further, when the IPA mist is large in size, the mass is heavy, thereby diminishing its moving speed. Therefore, in the drying process described in section (2) above, even if dry gas is supplied between the plural wafers in the processing vessel, there is an imbalance between the number of water droplets of the rinsing solution adhering to the wafer surface and the number of IPA mist particles. For example, when the number of IPA mist particles is smaller than the number of water droplets, IPA is not substituted for some of the water droplets which therefore remain, resulting in the generation of water marks.

In addition, since it is enormous in size and heavy, the IPA mist hardly passes through the narrow gaps between wafers. Therefore, in wafers having a diameter as large as 300 mm, almost all the IPA mists adhere to the wafer surface near the supply port of the IPA mist before the IPA mists reach the wafer surface which is relatively farther from the supply port. Accordingly, in the wafer surface distantly located from the supply port, the number of IPA mists supplied becomes smaller, and there is no even supply of IPA mists. The number of IPA mists supplied to the wafer surface near the supply port of the IPA mist is more than required while the number of IPA mists supplied to the wafer surface distantly located from the supply port is insufficient, resulting in the situation where IPA is not sufficiently substituted for the rinsing solution adhering to that part of the wafer surface which is distantly located from the IPA mist supply port, thereby resulting in the generation of water marks.

The state in which IPA is substituted for water droplets will be described with reference to FIG. 11. FIG. 11 is a sectional view schematically showing the relationship between the IPA mist and water droplets of the rinsing solution (hereinafter referred to as DIW) adhering onto the wafer W in the drying process. In the drying process described in section (2) above, as shown in FIG. 11(a), a mixture of a nitrogen gas $N_2$ and the IPA vapor containing large-size IPA mist (liquid) is supplied into the processing vessel, for application to the spaces between wafers W. As shown in FIG. 11(b), although the IPA vapor is intended to replace DIW, the moving speed is slow due to the large size of the IPA mist, and because many wafers (50 to 100 wafers) with a diameter of as large as 300 mm are simultaneously processed in the processing vessel, the number of IPA mists is likewise limited, and thus there are occasions when the IPA mist does not reach all the DIWs. Thus, the IPA mist adheres to that portion of the wafer surface near the dry gas supply port before it reaches that portion of the wafer surface which is farther from the dry gas supply port, and thus no IPA mist is supplied to the wafer surface distantly located from the dry gas supply port. Accordingly, as shown in FIG. 11(c), DIW remains on the wafer surface, which results in the generation of water marks.

In the substrate processing apparatus disclosed in Japanese Laid-Open Patent No. H11-191549, the organic solvent is heated and evaporated to generate the mixture of organic solvent vapor and inert gas in the evaporation vessel without bubbling the inert gas in the organic solvent, and then the mixed gas is heated and kept constant while it is diluted with another inert gas originating from a piping, and the mixed gas is then emitted through a jet nozzle. In the above-mentioned substrate processing apparatus, the organic solvent vapor originating and emitted from the piping and the nozzle completely becomes the mixed gas to be used. In such event, because the size of the gaseous organic solvent molecule is much smaller than that of the mist, the problem related to the generation of water marks due to the use of the organic solvent mist does not arise.

However, even if the substrate processing is performed with the organic solvent vapor which completely becomes the mixed gas, because the concentration of organic solvent vapor in the dry gas does not go beyond the saturation point, the absolute amount of organic solvent in the dry gas is rather small. Accordingly, the spread of the organic solvent vapor to every corner of the large substrate to replace the moisture of the substrate surface takes considerable time and therefore the substrate processing apparatus disclosed in Japanese Laid-Open Patent No. H11-191549 does not address the need to decrease and substantially eliminate the number of water marks formed on the substrate surface while increasing the speed of carrying out the drying processing.

Although the term "vapor" generally means "gas" in the technical field of substrate processing, "vapor" can also refer to a gas containing "micro liquid particles (mist)", such as the dry gas previously referred to. Accordingly, both meanings shall apply when "vapor" is mentioned in the present description and the claims.

DISCLOSURE OF THE INVENTION

As a result of various studies conducted by the inventors considering the abovementioned prior references, the inventors discovered that when the size of the mist constituting the organic solvent vapor becomes extremely smaller, the number of organic solvent mist particles can be increased without the need of increasing the amount of organic solvent to be consumed. Further, although the surface area of a particular mist diminishes, the whole surface area expressed by a summation of the mists can be increased by causing the number of mists to increase. When the organic solvent vapor in which the surface area of the entire number of mists is increased is injected to the substrate surface, the organic solvent vapor can cover all water droplets adhering to the substrate, so that the organic solvent can efficiently be substituted for the water droplets.

The first object of the invention is to provide a substrate processing method in which not only high-quality substrate surface processing is realized but in which processing time is also shortened by using dry gas containing micro-size organic solvent mist.

The second object of the invention is to provide a substrate processing method in which not only high-quality substrate surface processing is realized but in which the processing time is shortened by adjusting the concentration of micro-size organic solvent mist in the dry gas.

The third object of the invention is to provide a substrate processing apparatus in which not only high-quality substrate surface processing is realized but in which the processing time is shortened by easily forming the dry gas containing micro-size organic solvent mist.

The fourth object of the invention is to provide a substrate processing apparatus in which not only high-quality substrate surface processing is realized but in which the processing time is shortened by adjusting the concentration of micro-size organic solvent mist in the dry gas.

In order to solve the above problems, the substrate processing method according to claim 2 of the present invention, in which the surface of a substrate is dried by injecting it with dry gas consisting of a mixture of an organic solvent vapor and an inert gas, characterized in that the dry gas is formed by bubbling the inert gas in an organic solvent in a vapor generating unit, wherein the temperature of the vapor generating unit is set at $T_1$, the temperature of the mixed gas containing the organic solvent and the inert gas is set at $T_2$ from the vapor generating unit to a jet nozzle, and the temperature of the dry gas emitted from the jet nozzle is set at $T_3$, the temperatures being controlled such that the following relationship holds: $T_1 \leq T_2 \leq T_3 \leq$ the boiling point of the organic solvent, and the dry gas emitted from the jet nozzle consists of organic solvent mists of submicron size.

According to the substrate processing method described in claim 2, the mixed gas is obtained by bubbling the inert gas in the organic solvent, and the mixed gas is formed out of the inert gas which includes the organic solvent vapor containing the organic solvent mist and organic solvent gas whose concentration is lower than the saturation point. The temperature of the mixed gas is controlled or maintained at constant temperature or gradually increased until the mixed gas is emitted from the jet nozzle. Therefore, the organic solvent is gradually vaporized from the surface of the organic solvent mist as to decrease the diameter of the mist particles during movement and the dry gas including the organic solvent mist of submicron size is easily obtained. Further, since the mist contained in the organic solvent vapor is minimized to submicron size, the number of particles of the organic solvent mist can be increased without increasing the amount of organic solvent to be consumed. Further, although the surface area of the individual mist is decreased, the whole surface area which is the summation of the surface areas of the particular mists can be increased by causing the number of mists to increase. Therefore, since a large amount of mists of submicron size can be emitted onto the substrate surface, a large amount of the organic solvent mist of submicron size is efficiently substituted for the rinsing solution adhering to the substrate. As a result, even if many substrates having a large diameter are loaded in the processing vessel, since the mists of submicron size can rapidly cover spaces between substrates, the processing time can be shortened while the level of drying processing efficiency is improved, and the generation of water marks can be extremely avoided or substantially eliminated in the substrate surface. Further, particle adhesion is eliminated and the speed of drying processing is increased, so that re-adhesion of particles can be prevented.

The invention according to claim 3 of the subject application is a substrate processing method in which a substrate surface is dried by injecting dry gas containing a mixture of an organic solvent vapor and an inert gas to a substrate, the substrate processing method characterized in that the dry gas comprising a mixture of inert gas and the organic solvent vapor is further diluted with dilution gas of the same kind of inert gas, the mixed gas being formed by bubbling the inert gas in an organic solvent in a vapor generating unit, wherein the temperature in the vapor generating unit is set at $T_1$, the temperature of the mixed gas is set at $T_2'$ from the vapor generating unit until the mixed gas is diluted with the dilution gas, the temperature of the dilution gas is set at $T_4$, the temperature of the mixed gas containing the organic solvent and the inert gas is set at $T_2''$ to the jet nozzle after the mixed gas is diluted with the dilution gas, and the temperature of the dry gas emitted from the jet nozzle is set at $T_3$, and the temperatures are controlled such that the following relationship holds: $T_1 \leq T_2' \leq T_4 \leq T_2'' \leq T_3 \leq$ boiling point of organic solvent, and the organic solvent mist of submicron size is included in the dry gas emitted from the jet nozzle.

According to the substrate processing method described in claim 3, the mixed gas formed in the vapor generating unit out of the inert gas and the organic solvent vapor containing the organic solvent mist and the organic solvent gas whose concentration is lower than saturation point, is further diluted with additional dilution gas of the same kind of inert gas used in the bubbling. The concentration of organic solvent vapor is further reduced in the mixed gas while the possibility of the organic solvent mist being condensed diminishes, and the IPA mist can be carried between the wafers. Therefore, since temperature is controlled such that the mixed gas is kept at constant temperature or gradually increased until the mixed gas is emitted from the jet nozzle, the speed and efficiency with which a part of the organic solvent is vaporized from the surface of the organic solvent mist to become the micro mist are increased, and the large amount of dry gas containing the organic solvent mist of submicron size is obtained while the concentration thereof remains low, which allows a large quantity of the organic solvent mist of submicron size to be continuously injected to the substrate surface. Even if many substrates having a large diameter are loaded in the processing vessel, since the mist of submicron size can rapidly invade the gaps between substrates, the continuously supplied large amounts of organic solvent vapor of submicron size are rapidly substituted for the rinsing solution adhering to the substrate. As a result, the processing time can be shortened while the level of drying processing efficiency is improved, and acceleration of the drying processing is likewise achieved. Accordingly, the processing time can be shortened while the level of drying processing efficiency is improved without increasing the amount of organic solvent consumed, and the generation of water marks can be extremely avoided or substantially eliminated in the substrate surface. Further, particle adhesion is eliminated and the speed of drying processing is increased, so that re-adhesion of the particle can be prevented.

In the substrate processing method described in either of claims 2 or 3, the invention according to claim 4 of the subject application is characterized in that the organic solvent is at least one kind selected from a group including isopropyl alcohol, diacetone alcohol, 1-methoxy-2-propanol, ethyl glycol, 1-propanol, 2-propanol, and tetrahydrofuran, and the inert gas is at least one kind selected from a group including nitrogen, argon, and helium.

According to the substrate processing method described in claim 4, the selection width of the organic solvent and the inert gas is broadened, and the substrate processing apparatus can be applied to various kinds of the substrate processing by an arbitrary combination.

The substrate processing apparatus according to claim 6 of the invention refers to a substrate processing apparatus comprises a vapor generating unit which generates a mixture of an organic solvent vapor and an inert gas by bubbling the inert gas in an organic solvent; support means for supporting a plurality of substrates to be vertically arranged in parallel at equal pitches; a rinsing processing vessel which accommodates the plurality of substrates supported by the support means; a lid for covering the upper opening of the rinsing processing vessel; jet nozzles which are provided in the lid; and first piping which allows the vapor generating unit and the jet nozzles to communicate with each other, the substrate processing apparatus characterized in that the first piping and the jet nozzles are respectively equipped with heaters, wherein the temperature in the vapor generating unit is set at $T_1$, the temperature in the first piping is set at $T_2$, and the temperature in the jet nozzle is set at $T_3$, and the temperatures are controlled by the respective heaters such that the following relationship holds: $T_1 \leq T_2 \leq T_3 \leq$ boiling point of organic solvent, and the organic solvent mist of submicron size is included in the dry gas emitted from the jet nozzle.

According to the substrate processing apparatus described in claim 6, the dry gas including the organic solvent of submicron size can easily be formed by controlling the heaters at appropriate locations, and thus the substrate processing apparatus which can easily carry out the substrate processing method described in claim 2.

According to claim 7 of the invention, the substrate processing apparatus comprises a vapor generating unit which generates a mixed gas of an organic solvent vapor and an inert gas by bubbling the inert gas in an organic solvent; support means for supporting a plurality of substrates to be vertically arranged in parallel at equal pitches; a rinsing processing vessel which accommodates multiple substrates supported by the support means; a lid for covering the upper opening of the rinsing processing vessel; jet nozzles which are provided in the lid; and first piping which allows the vapor generating unit and the jet nozzles to communicate with each other, the substrate processing apparatus characterized in that a second piping is provided and connected to the middle portion of the first piping for supplying dilution gas of the same kind of inert gas, whereby the first piping, the second piping, and the jet nozzles are respectively equipped with heaters, wherein the temperature in the vapor generating unit is set at $T_1$, the temperature in the first piping is set at $T_2'$ from the vapor generating unit to the point at which it is connected with the second piping, the temperature in the second piping is set at $T_4$, the temperature in the first piping is set at $T_2''$ the point at which it is connected with the second piping to the nozzle, and the temperature in the jet nozzle is set at $T_3$, and the temperatures are controlled by the respective heaters such that the following relationship holds: $T_1 \leq T_2' \leq T_4 \leq T_2'' \leq T_3 \leq$ boiling point of organic solvent, and the organic solvent mist of submicron size is part of the dry gas emitted from the jet nozzle.

According to the invention of the substrate processing apparatus described in claim 7, the substrate processing apparatus can easily carry out the substrate processing method described in claim 3.

According to claim 8 of the invention, the substrate processing apparatus described in claim 7 is further characterized in that a static mixer is provided downstream from the point of connection between the first piping and the second piping and upstream in respect of the jet nozzle.

According to the substrate processing apparatus described in claim 8, in the substrate processing apparatus described in claim 7, since the static mixer is provided downstream from the point of connection between the first piping and the second piping and upstream in respect of the jet nozzle, the inert gas, the organic solvent mist, and the organic solvent gas are sufficiently mixed to obtain a homogeneous mixed gas. Therefore, the formation efficiency of the micro mist is improved.

According to claim 9 of the invention, the substrate processing apparatus described in any one of claims 6 to 8, is characterized in that the organic solvent is at least one kind selected from a group including isopropyl alcohol, diacetone alcohol, 1-methoxy-2-propanol, ethyl glycol, 1-propanol, 2-propanol, and tetrahydrofuran, and the inert gas is at least one kind selected from a group including nitrogen, argon, and helium.

According to the substrate processing apparatus described in claim 9, the selection width of the organic solvent and the inert gas is broadened, and the substrate processing apparatus can be applied to various kinds of substrate processing by any arbitrary combination.

BRIEF DESCRIPTION OF THE DRAWINGS

FIG. 6 is a view showing a timing chart of a series of processing steps;

FIG. 7(a) is a sectional view illustrating the cleaning process, FIG. 7(b) is a sectional view illustrating the drying process 1, FIG. 7(c) is a sectional view illustrating the drying process 2, and FIG. 7(d) is a sectional view illustrating the drying process 3;

FIG. 10 is a sectional view showing the conventional substrate processing apparatus.

BEST MODE FOR CARRYING OUT THE INVENTION

A preferred embodiment of the invention will be described hereafter with reference to the drawings. However, the substrate processing method and substrate processing apparatus referred to in the embodiment are merely used as examples embodying the technical idea of the invention and are not intended to limit the applicability of the invention as the invention can be also applied to other modes without departing from the scope of claims.

Figure 1:
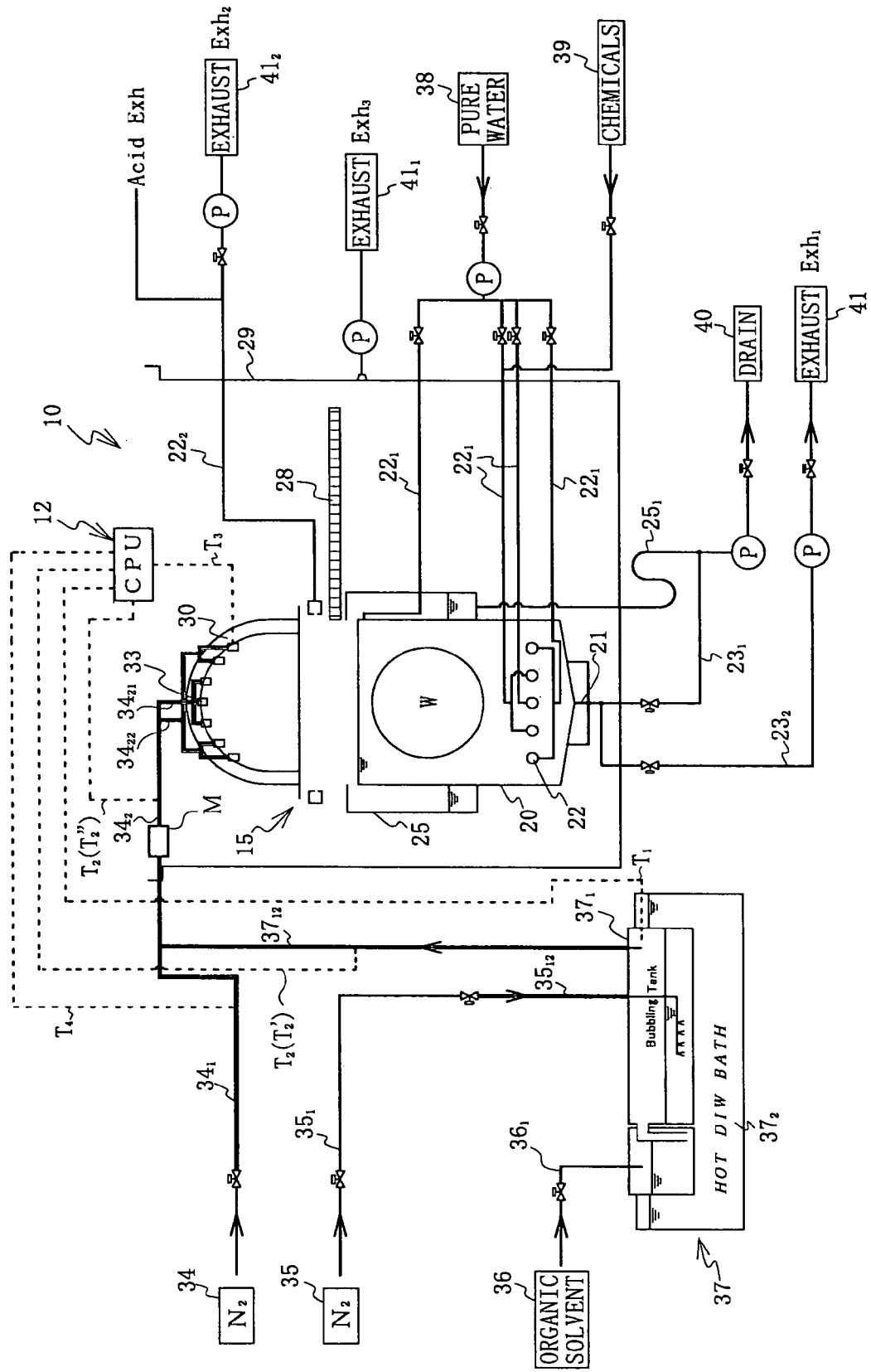
FIG. 1 is a sectional view showing a substrate processing apparatus according to an embodiment of the invention.

Referring to FIG. 1, a substrate processing apparatus 10 is an apparatus for processing the semiconductor wafer W which represents an example of a substrate. The term "processing" shall include the processes of etching the wafer W with chemicals, performing hydrofluoric acid treatment to the surface of the wafer W, rinsing the wafer W, and applying drying processing to the wafer W after rinsing with the organic solvent, and the like. These processing steps are continuously performed in series in one processing vessel 15.

As shown in FIGS. 2 to 5, the processing vessel 15 is placed in a housing chamber 11 having sufficient capacity with which to accommodate the processing vessel 15 and accessories thereof (not shown), which include an air conditioning device in the accommodation chamber, a supply source which supplies various processing solutions to the processing vessel, and a wafer conveying mechanism. The processing vessel 15 comprises an inner vessel 20, an outer vessel 25, and a lid 30. The inner vessel 20 is formed in a bottomed box shape, and the upper surface thereof is exposed. The outer vessel 25 surrounds the upper outer periphery of the inner vessel 20 and the opening of the inner vessel 20 is covered with the lid 30. The inner vessel 20 and outer vessel 25, which are made of material which is corrosion-resistant to the organic solvent such as hydrofluoric acid and IPA, e.g., polyvinylidene fluoride material, are accommodated in a sink 29.

Figure 2:
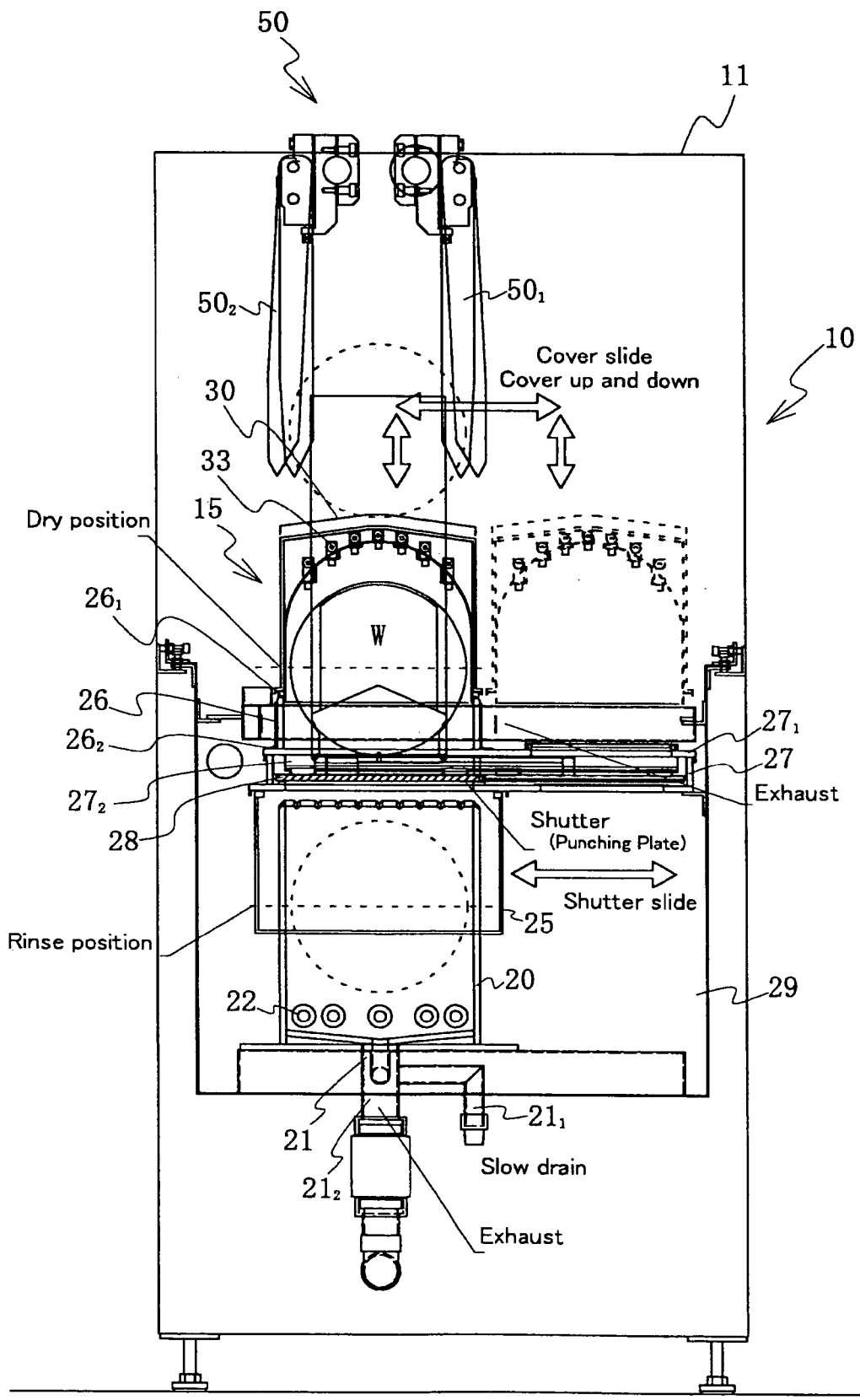
FIG. 2 is a side view showing a processing vessel referred to in the embodiment of the invention.
Figure 3:
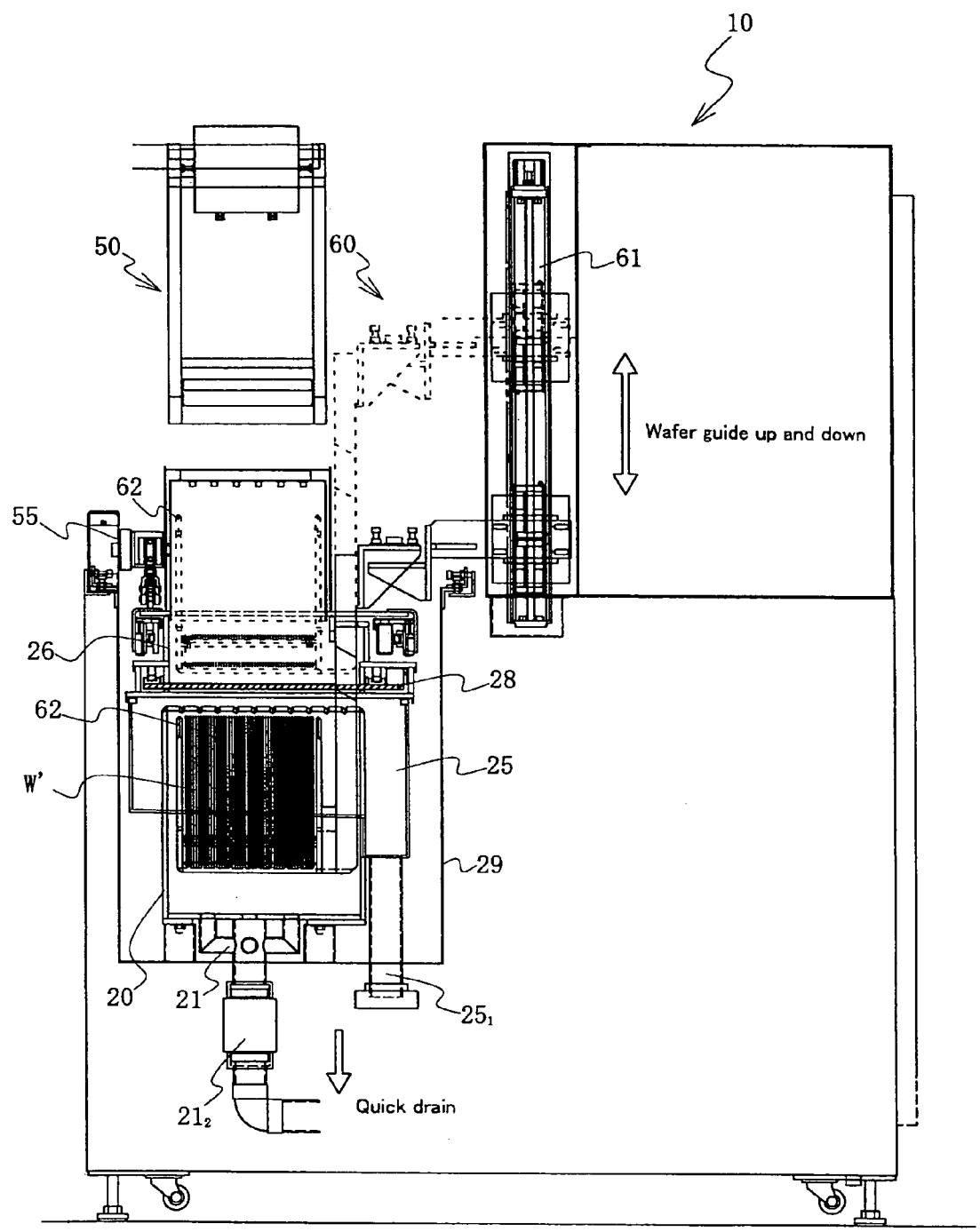
FIG. 3 is a side view showing the processing vessel of FIG. 2 when viewed from the opposite side.

The inner vessel 20 has sufficient depth to allow substrate processing by dipping a large number of wafers W (e.g., about 50 wafers W) having a diameter of as large as 300 mm in the processing solution while being held by a substrate holder 62 (see FIG. 3). A processing solution drain unit 21 and a processing solution supply unit 22 are provided on the bottom portion of the inner vessel 20. In the substrate holder 62, the plural wafers W are vertically held in parallel by a cassette guide (for example) at equal pitches. The substrate holder 62 is coupled to a lifting mechanism 60, which is provided with a lifting means 61, and the substrate holder 62 is taken out and put into the inner vessel 20 by vertically moving the substrate holder 62 with the lifting means 61. In FIG. 2, the drying process position is indicated as "Dry Position" while the rinsing process position is indicated as "Rinse Position." An air cylinder mechanism may serve as the lifting means 61.

As shown in FIG. 3, multiple wafers are taken out of the substrate holder 62 by means of a moving mechanism 50. The moving mechanism 50 includes plural holding pawls $50_1$ and $50_2$ coupled to a robot mechanism (not shown), and the wafers are held and moved to a predetermined location by the holding pawls $50_1$ and $50_2$. As shown in FIG. 2, the processing solution drain unit 21 is equipped with an outlet $21_1$ having a small diameter and an outlet $21_2$ having a large diameter. The outlet $21_2$ functions as a draining mechanism which rapidly discharges the processing solution in the processing vessel. The outlet $21_1$ having a small diameter drains the processing solution that has accumulated in the bottom portion of the inner vessel 20 and inside the piping. The outer vessel 25, which is provided with an outlet $25_1$ at the lower portion thereof, functions as an overflow receptacle for the processing solution overflowing from the upper portion of the inner vessel 20.

Figure 5:
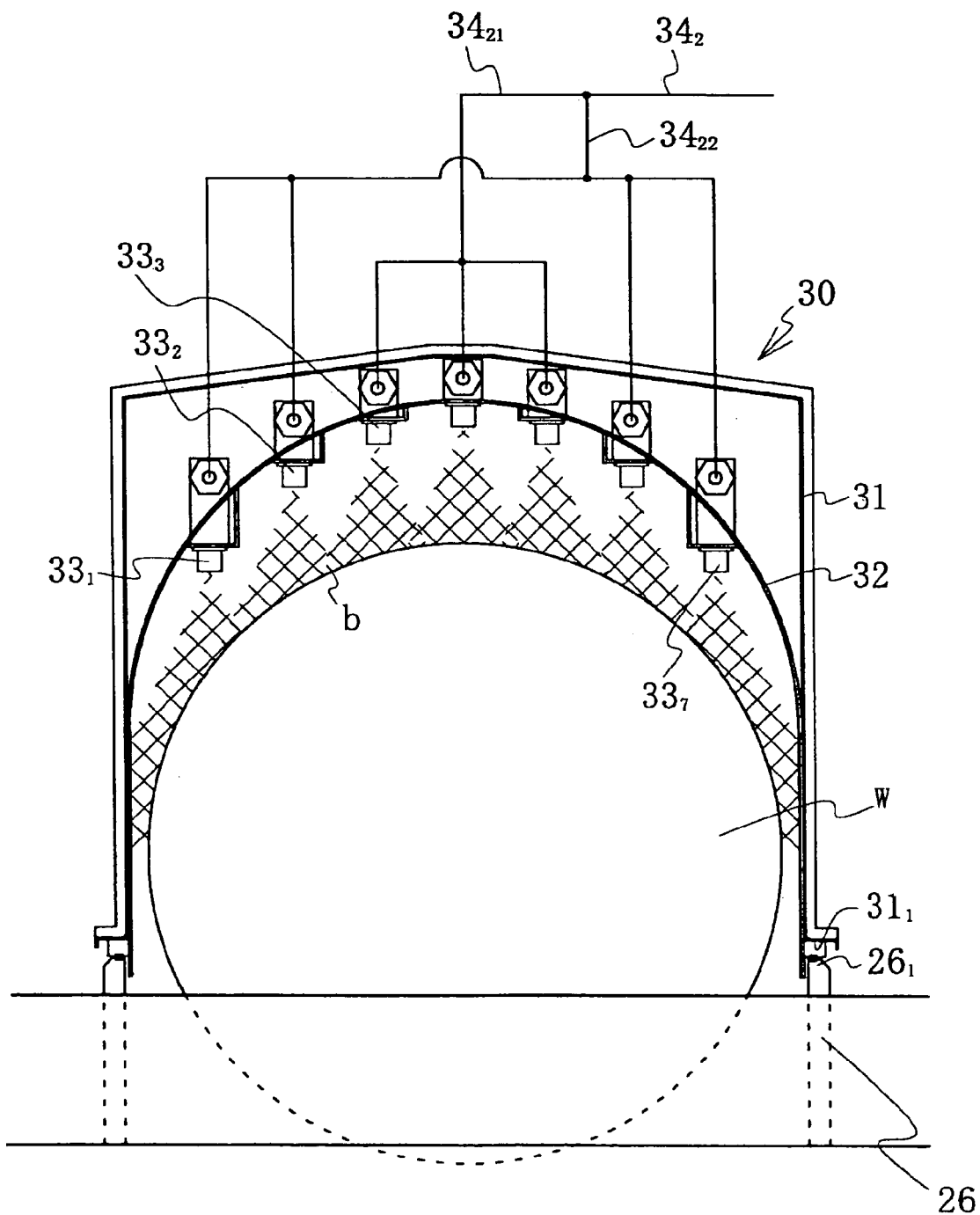
FIG. 5 is a side view of the lid illustrated in FIG. 4.

As shown in FIG. 5, the lid 30 includes a box-shaped container 31, the lower portion of which is exposed while the upper portion thereof is closed. Multiple wafers collected to form a group of wafers W' can be housed in the box-shaped container 31. The box-shaped container 31 is made of material which is corrosion-resistant to the organic solvent such as hydrofluoric acid and IPA. The lid 30 can be moved horizontally by moving means 55 (see FIG. 3). The opening of the inner vessel 20 can be closed and opened through the moving means 55, which causes the lid 30 to move horizontally on the upper portion of the inner vessel 20 as shown in FIG. 2. In other words, the moving means 55 vertically lifts the lid 30 located on the inner vessel 20 for a predetermined distance, horizontally moves the lid 30, and then vertically lifts the lid 30 again to hold it in standby position. The lid 30 moves when the group of wafers W' is conveyed into the inner vessel 20 or when they are taken out of the inner vessel 20 after processing.

Figure 4:
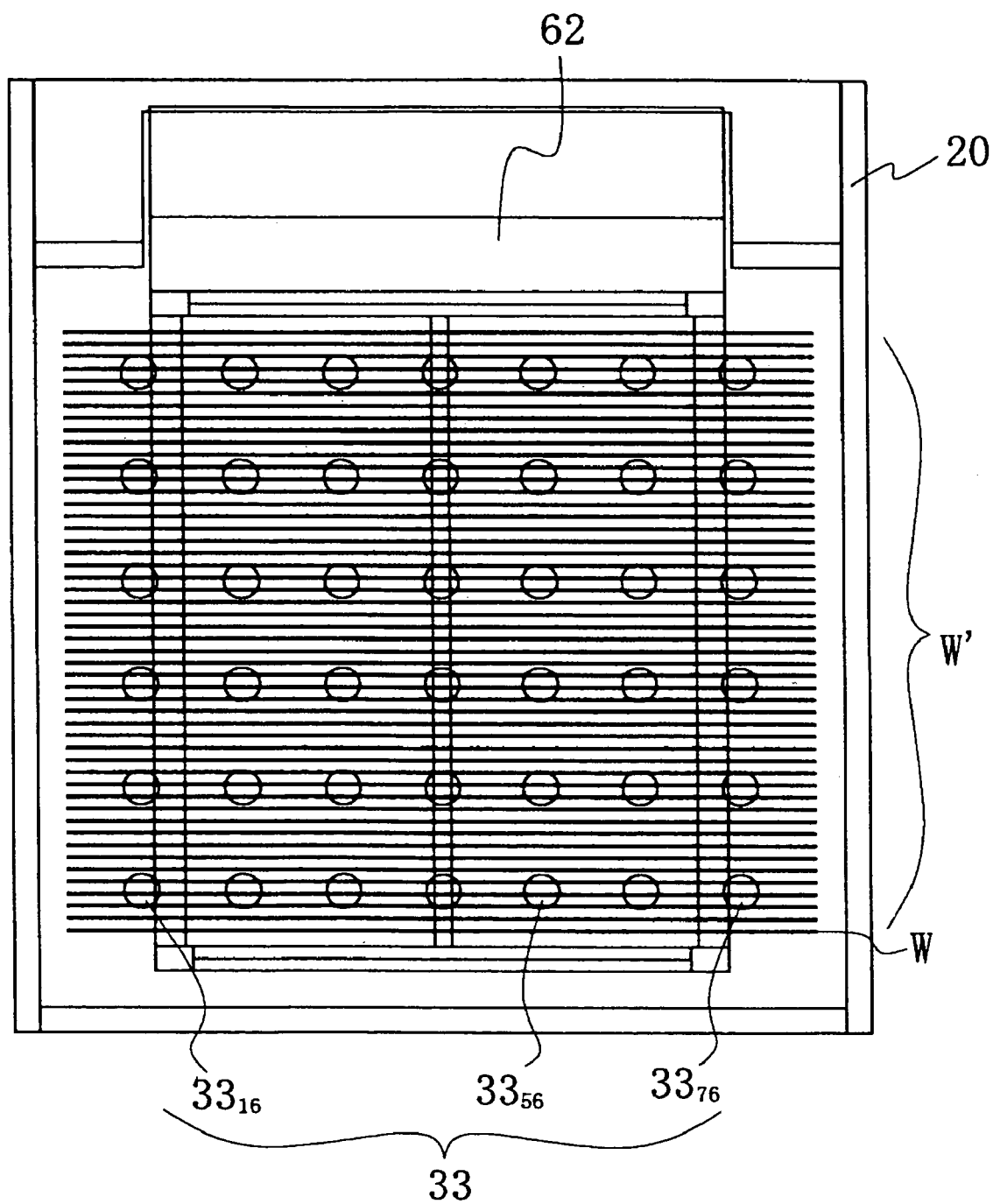
FIG. 4 is a plane phantom view of the processing vessel referred to in the embodiment of the invention when viewed from an upper portion of the lid thereof.

As shown in FIG. 5, a ceiling surface 32 substantially having the shape of an arch is formed in the upper portion of the box-shaped container 31. In the ceiling surface 32, plural jet nozzles $33_1$ to $33_7$ which inject the inert gas are arrayed in four directions at substantially equal intervals. As shown in FIG. 4, in the plural jet nozzles $33_1$ to $33_7$ located above the outer edge of the group of wafers W', seven columns of jet nozzles $33_1$ to $33_7$ are arranged at substantially equal intervals, and six rows of jet nozzles $33_1$ to $33_7$ are also arranged at substantially equal intervals, such that the 42 jet nozzles $33_1$ to $33_{76}$ are arranged in the outer circumference of the group of wafers W'. As shown in FIG. 5, the seven columns of jet nozzles $33_1$ to $33_7$ are arranged in the ceiling surface 32 in such manner that they are nearly equidistant from the outer circumference of the group of wafers. Since the wafer W is substantially disk-shaped, such distances can easily be made uniform by designing the ceiling surface 32 to have the shape of an arch. It is preferable that the shape of the ceiling surface be compatible with the shape of the wafer W to achieve substantial equality of such distances.

As shown in FIG. 5, a gas supply pipe $34_2$ is connected to the jet nozzle 33, and the gas supply pipe $34_2$ branches into branch pipes $34_{21}$ and $34_{22}$. The same number of jet nozzles 33 or the substantially same number of jet nozzles 33 is connected to each of the branch pipes $34_{21}$ and $34_{22}$. In such manner, the gas can be substantially evenly distributed among the jet nozzles. A jet nozzle in which the injection gas is diffused at a predetermined angle is referred to as the jet nozzle 33. It is preferable that when the jet nozzle 33 injects the gas to the outer circumference of the group of wafers W', the jet nozzle 33 should be arranged in such manner that the injection gas coming from adjacent jet nozzles, e.g., the gas emitted from the jet nozzle $33_2$ and the gas emitted from the jet nozzle $33_3$ overlap each other in the outer circumference b of the group of wafers W'. The plural jet nozzles 33 are arrayed in the ceiling surface 32, which allows the gas to be substantially evenly supplied to the group of wafers W'.

The jet nozzle 33 is basically conically shaped and provided with a hole on the tapered leading end thereof, from which the dry gas is ejected. Each jet nozzle 33 is equipped with a heater (not shown). Detailed description of the jet nozzle will be omitted because it is publicly known. Further, the gas supply pipe $34_2$ and the branch pipes $34_{21}$ and $34_{22}$ branching off from the pipe $34_2$ are equipped with heaters (not shown) on the respective outer wall surfaces thereof. For example, a belt heater is used and the heaters are connected to a control processing unit (CPU) 12 which controls the heaters.

As shown in FIGS. 2, 3, and 5, an intermediate connecting member 26 and a porous plate inserting mechanism 27 are arranged between the inner vessel 20 and outer vessel 25 and the lid 30. The intermediate connecting member 26 has a cylindrical body whose opening is the same as that of the lower opening of the lid 30, and is made of material which is corrosion-resistant to the organic solvent such as hydrofluoric acid and IPA. The intermediate connecting member 26 is arranged above the porous plate inserting mechanism 27 and a lower opening $26_2$ is positioned therein so as to abut the upper surface of a frame body $27_1$ in which a porous plate 28 is housed, and an upper opening $26_1$ is fitted in the lower opening $31_1$ of the box-shaped container 31. The intermediate connecting member 26 however may be omitted by directly fitting the lid 30 in the frame body $27_1$.

The porous plate 28 includes a flat plate in which several small holes are made on the surface thereof. The flat plate is inserted between the inner vessel 20 and outer vessel 25 and the intermediate connecting member 26 during the process of drying the group of wafers W' after the predetermined processes are finished. The porous plate 28, which is likewise made of material which is corrosion-resistant to the organic solvent such as hydrofluoric acid and IPA, is housed in the frame body $27_1$. The porous plate 28 is coupled to a moving mechanism (not shown) and horizontally moved in a sliding manner as shown in FIG. 2. The frame body $27_1$ housing the porous plate 28 has a predetermined longitudinal width (in the vertical direction), and a gap $27_2$ is formed between the frame body $27_1$ and the porous plate 28 when the porous plate 28 is housed in the frame body $27_1$.

The gap $27_2$, for example, is about 2 mm. In the drying process, part of the dry gas is outgassed into the sink 29. Therefore, since the gap $27_2$ is formed between the inner vessel 20 and the lid 30 (gap $27_2$ is expressed by "x" in FIG. 7), a half-closed state is formed between the inner vessel 20 and the lid 30 by the gap x, i.e., the half-closed state is formed between the drying processing unit and the rinsing processing unit and the sink 29. The porous plate 28 is inserted between the inner and outer vessels 20 and 25 and the intermediate connecting member 26 to partition the inner vessel 20 and the lid 30. In other words, the porous plate 28 functions as a shutter which separates the rinsing processing unit from the drying processing unit.

Hereafter, piping connection between the processing vessel 15 and its accessories will be described with reference to FIG. 1. A processing solution introducing pipe $22_1$ is connected to the processing solution supply unit 22 provided in the bottom portion of the inner vessel 20 and is also connected to a pure water supply source 38 through a flow control valve and a pump. The processing solution introducing pipe $22_1$, together with the flow control and the pump serves as the processing solution supply system, which also includes the rinsing solution supply means. A chemical supply source 39 is also connected to the processing solution introducing pipe $22_1$ through the flow control valve. The chemical supply source 39 includes chemical preparation means (not shown) for preparing the desired chemicals of predetermined concentration at a certain temperature. Depending on the purpose of processing (for example, rinsing, etching or oxidation), for example, the chemicals are selected from among hydrofluoric acid, hydrochloric acid, hydrogen peroxide, sulfuric acid, ozone water, ammonia water, surfactant, amine organic solvent, fluorine organic solvent, and deionized water. The appropriate solution in which the above chemicals should be mixed is used as needed.

As shown in FIG. 2, the processing solution drain unit 21 provided in the bottom portion of the inner vessel 20 includes an outlet $21_1$ of small diameter and an outlet $21_2$ of large diameter. The outlets $21_1$ and $21_2$ are connected to the inner vessel drain pipes $23_1$ and $23_2$, respectively. The drain pipe $23_1$ is connected to a drain processing facility 40 through an on-off valve, the pump, and the flow control valve. Similarly, the drain pipe $23_2$ is connected to an exhaust processing facility 41 through the on-off valve, the pump, and the flow control valve. The sink 29 is also connected to an exhaust processing facility $41_1$. A drain pipe $25_1$ is connected to the lower portion of the outer vessel 25, and the drain pipe $23_1$.

Further, a vapor supply mechanism 37, which is intended to accumulate the organic solvent such as isopropyl alcohol (IPA) solvent, is provided near the processing vessel 15. The organic solvent such as the IPA solvent easily mixes with the water remaining on and adhering to the surface of the wafer W, while having extremely little surface tension. The vapor supply mechanism 37 is provided with a vapor generation unit $37_1$ which heats the organic solvent, vaporizes the organic solvent and generates mists by bubbling the inert gas in the organic solvent. The vapor generation unit $37_1$ is dipped in hot water in a heating vessel $37_2$, and the organic solvent is heated at predetermined temperature. The vapor generation unit $37_1$ and the organic solvent supply source 36 are connected to each other with piping $36_1$, and IPA is supplied to the vapor generation unit $37_1$. Besides IPA, the organic solvent must be selected from the group including organic compounds such as diacetone alcohol, 1-methoxy-2-propanol, ethyl glycol, 1-propanol, 2-propanol, and tetrahydrofuran.

A second inert gas supply source 35 is connected to the vapor generation unit $37_1$ through piping $35_1$ and piping $35_{12}$. The nitrogen gas $N_2$ is supplied to the bottom portion of the vapor generation unit $37_1$ to generate (bubbling) bubbles in IPA that has accumulated in the vapor generation unit $37_1$, which forms the IPA vapor including the IPA gas and mist. Piping $37_{12}$ derived from the vapor generation unit $37_1$ is coupled to a gas supply pipe $34_2$ through a static mixer M, and the mixed gas of the carrier gas $N_2$ and the IPA vapor is supplied to the jet nozzle 33 from the vapor generation unit $37_1$. Heaters (not shown) are respectively provided on the outer wall surfaces of the pipings $35_{12}$, $37_{12}$, and $34_2$, and the temperatures thereof are controlled by the CPU 12. Meanwhile, the static mixer M is provided in order to homogenize the mixed gas by accelerating the degree of mixture of the mixed gas containing the carrier gas $N_2$ and the IPA vapor.

A first inert gas supply source 34 supplies inert gas such as nitrogen gas $N_2$ through piping $34_1$ to the piping $37_{12}$. The temperature of the piping $34_1$ is also controlled to a predetermined degree by the belt heater. The nitrogen gas $N_2$ does not merely dilute the mixture of inert gas and the organic solvent vapor from the vapor generation unit $37_1$, but is also useful for the purging and finish-drying steps in the processing vessel 15. Besides $N_2$, argon and helium are likewise appropriate for use as the inert gas.

Figure 7:
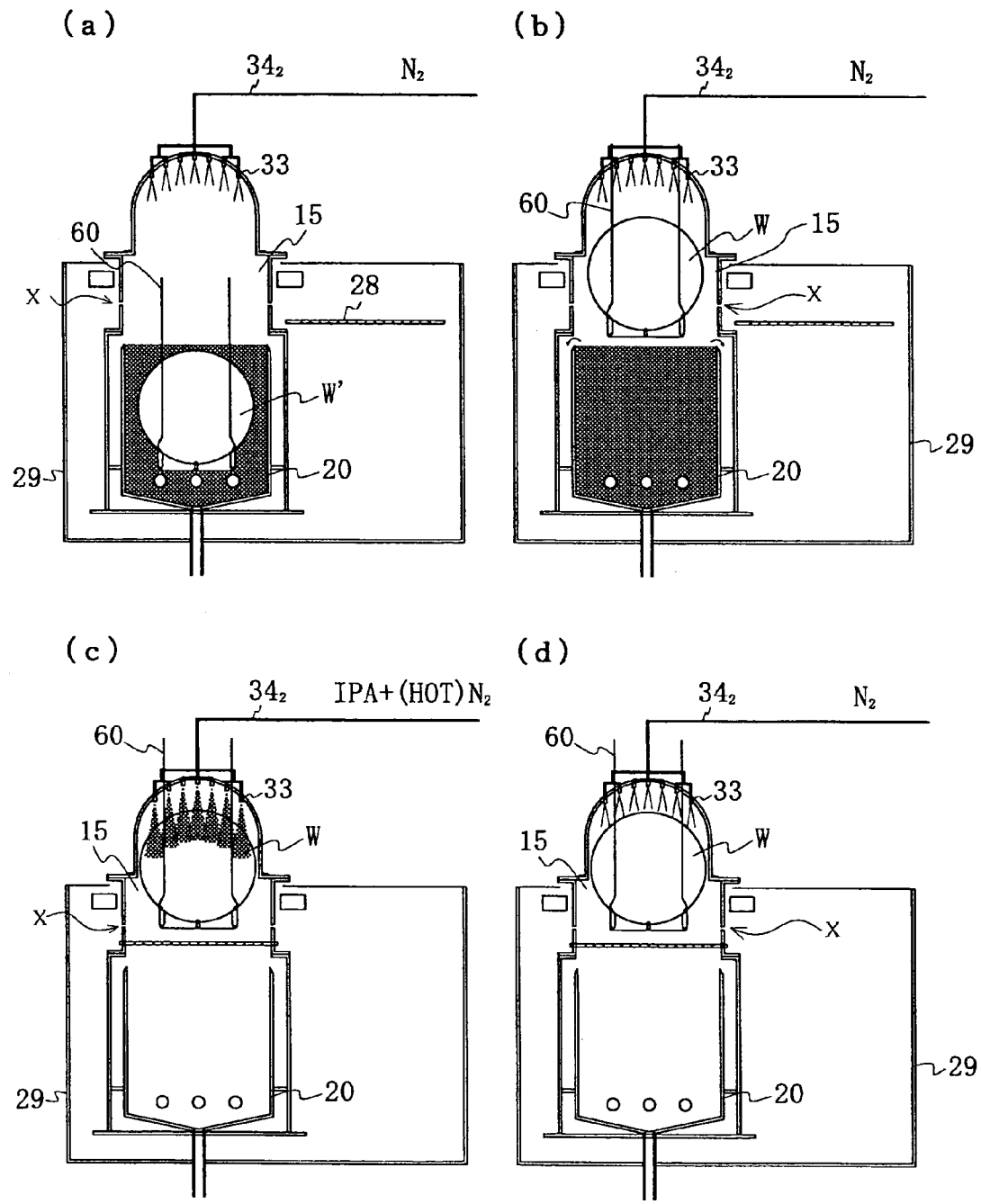
FIG. 7 shows a cleaning and drying process.

Hereafter, the series of processes carried out by the substrate processing apparatus will be described with reference to FIGS. 6 and 7. Referring to FIGS. 1 and 6, first, the lid 30 of the processing vessel 15 is opened, and multiple wafers W' are accommodated in the inner vessel 20, which is supplied at this point with the desired chemicals, e.g., hydrofluoric acid (HF) from the chemical supply source 39 through the processing solution introducing pipe $22_1$ and the processing solution supply unit 22, and the desired chemicals are then stored in the inner vessel 20. Accordingly, substrate processing (for example, etching, hydrofluoric acid treatment, and rinsing) is performed to the wafers W' by dipping them in the processing solution.

Upon the completion of such chemical processing, as shown in FIG. 7(a), the pure water DIW is supplied to the inner vessel 20 from the pure water supply source 38 through the processing solution introducing pipe $22_1$ and the processing solution supply unit 22, while overflowing from the upper portion of the inner vessel 20. The overflowing pure water DIW flows into the outer vessel 25, and is drained from the drain pipe $25_1$ through the drain pipe. The pure water is supplied for a relatively long period of time to wash out the chemicals HF which have remained in the inner vessel 20.

After the rinsing process, in one particular drying process 1 illustrated in FIG. 7(b), the continuous supply of pure water DIW is terminated, and the group of wafers W' is slowly raised from the inner vessel 20 (slow up speed) while being supplied with a small amount of pure water (DIW water-saving). The small amount of IPA vapor can also be simultaneously supplied into the processing vessel 15 while the group of wafers W' is being raised.

Then, in another drying process 2 illustrated in FIG. 7(c), a drain mechanism valve of the outlet $21_2$ lying at the bottom portion of the processing vessel 15 is operated to drain the processing solution rapidly, and the porous plate 28 is inserted between the inner vessel 20 and outer vessel 25 and the intermediate connecting member 26 by causing the porous plate 28 to horizontally move into the frame body $27_1$. Further, the hot dry gas containing the mixture of nitrogen gas $N_2$ and the IPA vapor is supplied to the inner vessel 20. These operations are performed as shown in the chart.

The dry gas is heated in the piping $34_2$ and the nozzle 33. In the drying process 2, the organic solvent vapor in the processing vessel 15 comes into contact with the surface of each wafer W, and the IPA mist is condensed onto the surface of the wafer W to form a film of IPA. When the organic solvent film is formed on the surface of the wafer W, IPA is substituted for the pure water adhering to the wafer W. Therefore, the degree of surface tension of the pure water decreases to allow it to flow down from or evacuate the surface of the wafer W, and IPA adhering to the substrate surface is evaporated.

In another drying process 3 illustrated in FIG. 7(d), the nitrogen gas $N_2$ is supplied in order to dry the substituted IPA, and the group of wafers W' is taken out of the processing vessel 15 when the drying process 3 ends.

In the above processes, pressure in the lid 30 (the drying processing unit) is set higher than that of the sink and the evacuating station for the sink, and pressure in the lid 30 is also set higher than that of the inner vessel 20 (rinsing processing unit) and pressure of the evacuating station for the inner vessel 20. Therefore, the nature of the flow of the dry gas becomes laminar flow in the drying processing unit, and the dry gas is smoothly evacuated from the exhaust pipe to the outside of the vessel. During this process, the dry gas is evenly supplied to each of the wafers, water marks do not form on the substrate surface, and particles that have settled thereon can be removed, and particles can be prevented from adhering to the substrate surface. Further, the re-adhesion of particles can be avoided because the dry gas does not circulate at all in the processing vessel.

At this point, the CPU 12 controls the heaters such that the relationship among the temperatures $T_1$, $T_2'$, $T_4$, $T_2''$, and $T_3$ at certain positions satisfies the following relationship:

$$T_1 \leq T_2' \leq T_4 \leq T_2'' \leq T_3 \quad (1)$$

where,
the temperature in the vapor generating vessel $37_1$ is $T_1$,
the temperature in the piping $37_{12}$ is $T_2'$,
the temperature in the piping $34_1$ is $T_4$,
the temperature in the piping $34_2$ is $T_2''$, and
the temperature in the jet nozzle is $T_3$.

Thus, the temperatures $T_1$, $T_2'$, $T_4$, $T_2''$, and $T_3$ at respective positions are set so as to satisfy the above expression (1), and thereby allow the size of the IPA mist emitted from the jet nozzle 33 to have an extremely small particle diameter, or specifically, extremely fine mist which cannot be observed in relation to the Tyndall phenomenon, i.e., mist having submicron size is formed. In other words, the mist can be observed by the Tyndall phenomenon if it consists of several particles having micron size but cannot be seen in relation to the Tyndall phenomenon when the mist comprises particles of submicron size, thereby requiring the use of a particular measuring device. In the embodiment of the present invention, since the size of the IPA mist cannot be confirmed by the Tyndall phenomenon, the mist formed constitutes particles of submicron size. However, it has been noted that the mist of submicron size is not completely formed in the gas, but exists in the liquid state. The temperature in the jet nozzle or $T_3$ is controlled so as not to exceed the boiling point (82.4° C.) of IPA to prevent the IPA mist from being completely vaporized.

The number of particles of the organic solvent mist can be increased without increasing the amount of organic solvent to be consumed by ensuring that the mist constituting the organic solvent vapor is of submicron size. Further, although the surface area of the individual mist is reduced, the whole surface area which is the summation of the surface areas of the particular mists proportionately increases in relation to the increase in the number of mists. As a result, because the organic solvent vapor can be injected to the substrate while a specific surface area thereof is increased, the level of substitution efficiency of the organic solvent for the rinsing solution is improved.

It is preferable that each temperature referred to in expression (1) is kept constant or gradually increased. That is, the mixed gas formed out of the inert gas including the IPA vapor containing the IPA mist and the IPA gas whose concentration is lower than the point of saturation is obtained by bubbling the inert gas in the IPA in the vapor generation unit $37_1$. The temperature of the mixed gas is kept constant or gradually increased until it is emitted from the jet nozzle, so that the condensation of organic solvent vapor in the piping and the jet nozzle is eliminated and as a result, the diameter of the organic solvent mist does not grow in the mixed gas. Further, IPA is gradually vaporized from the surface of the IPA mist to decrease the particle diameter of the IPA mist while the IPA moves from the piping and the nozzle, thereby allowing dry gas containing IPA mists of submicron size to be easily obtained.

Further, the mixed gas formed in the vapor generation unit $37_1$ out of the inert gas including the IPA vapor containing IPA mists and the IPA gas whose concentration is lower than the point of saturation is diluted with inert gas separately supplied from the piping $34_1$. Therefore, since the concentration of IPA gas diminishes in the mixed gas, dry gas containing IPA mists of submicron size can be supplied to the processing vessel 15 along with a large amount of inert gas while IPA vaporization from the IPA mist is accelerated. In this case, in mixing the newly supplied nitrogen gas $N_2$ with IPA vapor and the like, it is preferable that a mixer M is provided in the middle of the piping $34_2$ to stir the nitrogen gas $N_2$ and the IPA vapor. A static mixer is suitable as mixer M.

Thus, when numerous IPA mists of submicron sizes are contained in the dry gas, such mists can rapidly invade the spaces between substrates even if many substrates having a large diameter are loaded in the processing vessel 15, and the rapid supply of continuously large amounts of organic solvent vapor of submicron size to replace the rinsing solution adhering to the substrate is assured. As a result, substrate processing time can be shortened while the rate of drying processing efficiency is simultaneously improved, and the remarkable acceleration of the drying processing can be achieved. At the same time, the amount of organic solvent need not be particularly increased, While the generation of watermarks can be extremely reduced or substantially eliminated in the substrate surface. Further, particle adhesion is eliminated and the drying processing is accelerated so that re-adhesion of particles can be also prevented.

In the above mode, the inert gas for dilution is supplied from the piping $34_1$. The inert gas for dilution is not always required in order to obtain IPA mists of submicron size. In this case, temperature control simply may be performed so as to satisfy the expression (1), while the temperatures of the piping pieces $37_{12}$, $34_2$, $34_{21}$, and $34_{22}$ which connect the vapor generation unit $37_1$ and the nozzle 33 differ from one another. Alternatively, the pieces of piping $37_{12}$, $34_2$, $34_{21}$, and $34_{22}$ are kept at the same temperature $T_2$, and temperature may be controlled such that the following relationship holds:

$$T_1 \leq T_2 \leq T_3.$$

The temperature $T_3$ in the piping and the jet nozzle is set equal to or higher than the temperature $T_1$ of the organic solvent and the temperature $T_2$ of the inert gas supplied to the vapor generating unit. In this manner, condensation of the organic solvent vapor in the piping and the jet nozzle does not occur, so that the diameter of the organic solvent mist in the dry gas does not grow. In addition, part of the organic solvent is further vaporized from the surface of the organic solvent mist before the organic solvent is emitted from the nozzle, which allows the size of the organic solvent mist in the dry gas to become submicron. Further, since the organic solvent vapor is not condensed in the piping and the jet nozzle, there is no fear that IPA droplets will fall from the nozzle.

In the embodiment of the invention, it is preferable that the components of the substrate processing apparatus are configured as follows, in order to prevent the increase in diameter of the organic solvent mist and condensation thereof due to the collision of organic solvent mists with each other and the collision of the organic solvent mists with the walls of the apparatus. That is, the top portion of the bubbling tank of the vapor generating unit should have a conical or circular arc shape. In addition, the number of step differences in the dry gas supply piping has been decreased, and apertures are formed such that the size thereof is not remarkably bigger than that of prior art. Further, the bubbling nozzle in the vapor generating unit should have a small diameter and quick injection speed.

Figure 8:
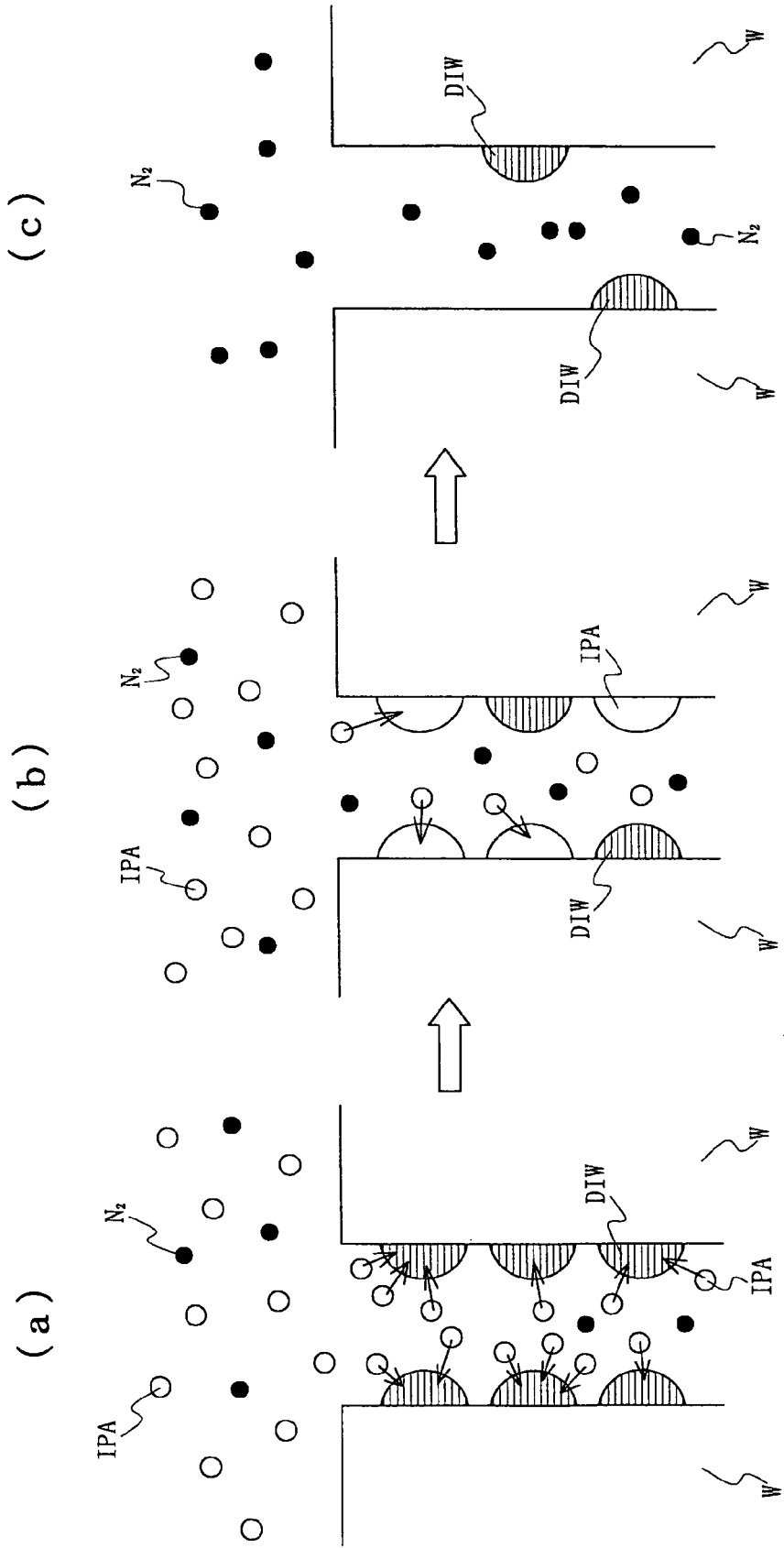
FIG. 8 is a sectional view schematically showing the relationship between the IPA vapor and a substrate in the drying process.
Figure 9:
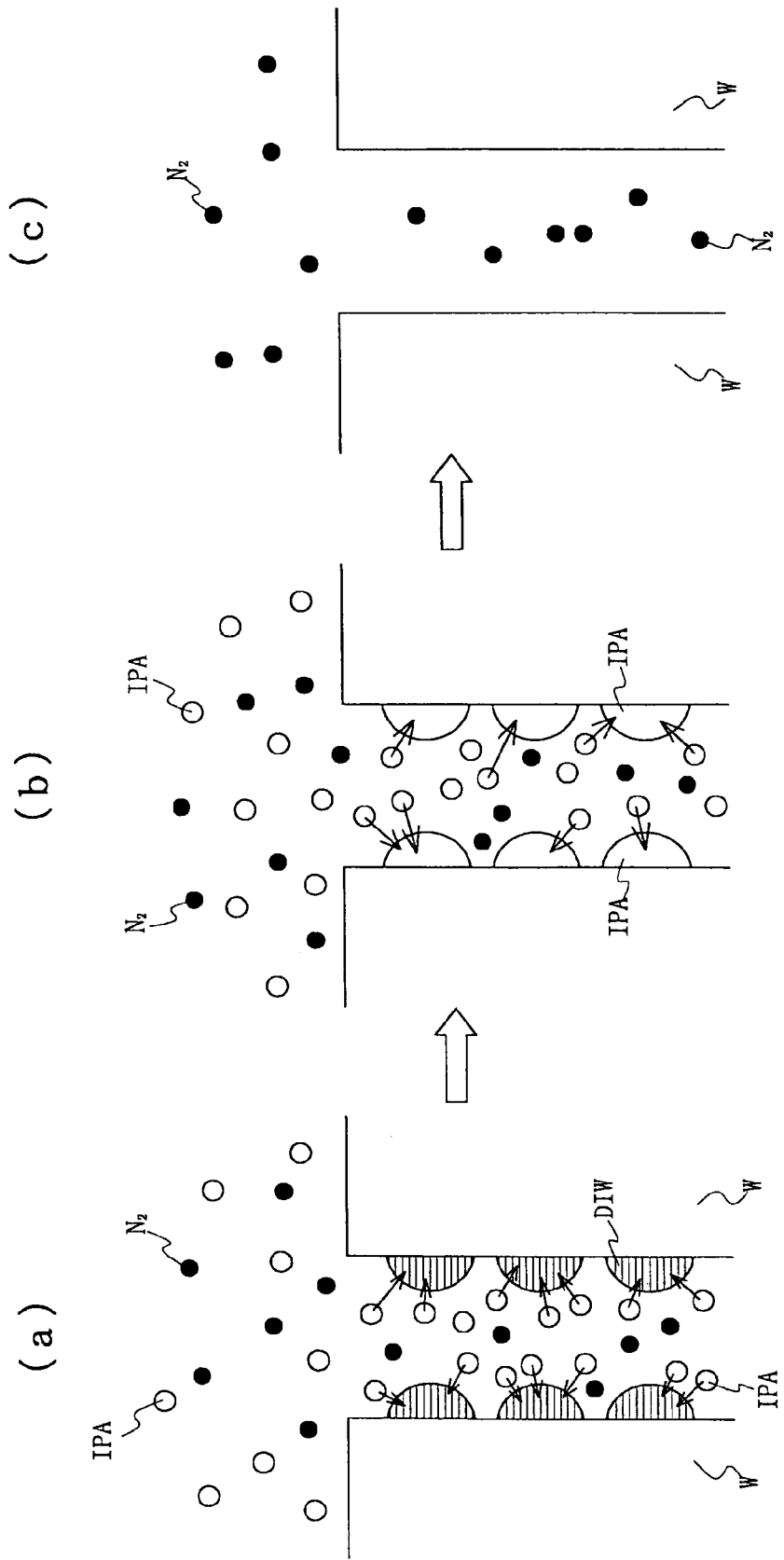
FIG. 9 is a sectional view schematically showing the relationship between the IPA vapor and a substrate in the drying process as illustrated in FIG. 8, when dilution nitrogen gas is used.
Figure 11:
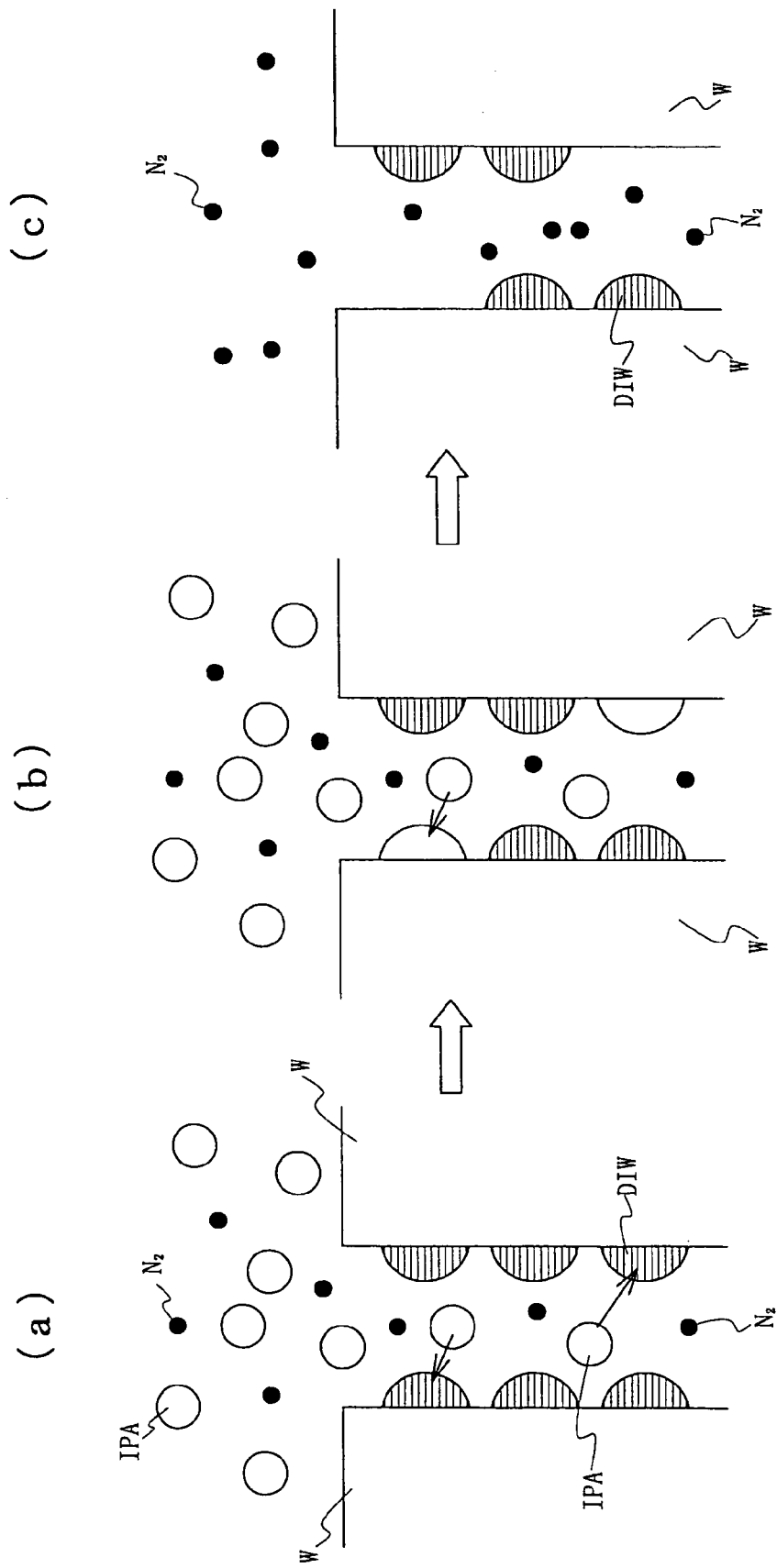
FIG. 11 is a sectional view schematically showing the relationship between the IPA vapor and a substrate in the drying process of the substrate processing apparatus illustrated in FIG. 10.

Finally, the state in which the IPA mist is made to substitute for the rinsing solution adhering to the substrate by using dry gas containing IPA mists of submicron size will be described. FIGS. 8 and 9 are sectional views schematically showing the relationship between the IPA vapor and the substrate during the drying processing. FIG. 8 illustrates the case where the dry gas is not diluted with inert gas while containing IPA mists of submicron size, while FIG. 9 shows the case in which the dry gas is diluted with inert gas while containing IPA mists of submicron size. FIGS. 8(a) and 8(b) and FIGS. 9(a) and 9(b) correspond to the process of "drying 2" shown in FIG. 6, while FIG. 8(c) and FIG. 9(c) correspond to the process of "drying 3" shown in FIG. 6.

As shown in FIG. 8(a), when the dry gas containing the mixture of IPA mists (liquid) of submicron size and the nitrogen gas $N_2$ (gas) is delivered to the processing vessel 15 and supplied in the spaces between the wafers W, IPA is substituted for DIW adhering to the wafer W by the supply of dry gas as shown in FIG. 8(b). Since the IPA mist comprises fine particles and many IPA mists are supplied, various IPA particles adhere to one DIW, and the IPA mist is therefore efficiently substituted for DIW. Then, as shown in FIG. 8(c), IPA is evaporated only by delivering $N_2$ gas into the processing vessel 15. In this case, in the process of "drying 2" (refer to FIGS. 8(a) and 8(b)), the IPA mist does not sufficiently perform the carrier effect due to the small amount of nitrogen gas $N_2$, supplied and good drying effect is obtained only to some degree by using IPA mists of submicron size. Still, however, on occasion water marks are generated by residual DIW in the process of drying wafers with a large diameter.

In the case where the dry gas containing IPA mists of submicron size is further diluted with inert gas, the IPA vapor concentration in the dry gas is reduced, such that the IPA mist is sufficiently distributed throughout the substrate. Therefore, as shown in FIG. 9, the IPA mists of submicron size can be continuously and evenly supplied even to the deeper portions of the wafers W due to the large amounts of carrier gas. Since the dry gas containing large amounts of carrier gas enables the IPA mists of submicron size to adhere rapidly to DIW, efficient substitution of DIW by the IPA mists takes place. Accordingly, the invention may also be used for drying wafers having a large diameter, since the level of drying processing efficiency has been increased, while reducing processing time because processing speed is accelerated. Further, as shown in FIG. 9(c), DIW can substantially be eliminated from the surface of the wafer W, such that the generation of water marks can be completely eliminated. A detailed description of FIG. 9 has been omitted since it differs from the case shown in FIG. 8 only in that new nitrogen gas is mixed.

What is claimed is:

1. A substrate processing method in which a substrate surface is dried by injecting it with dry gas comprising a mixture of an organic solvent vapor and an inert gas,
the substrate processing method characterized in that the dry gas is a mixture of inert gas and the organic solvent vapor, wherein the mixed gas is formed by bubbling the inert gas in an organic solvent in a vapor generating unit,
wherein the temperature in said vapor generating unit is set at $T_1$,
the temperature of the mixed gas containing the organic solvent and heated inert gas is set at $T_2$ from the vapor generating unit to a jet nozzle, and
the temperature of heated dry gas emitted from the jet nozzle is set at $T_3$,
and the temperatures are controlled such that the following relationship holds:
$T_1 \leq T_2 \leq T_3 \leq$ boiling point of organic solvent, and
the organic solvent mist of submicron size is part of the dry gas emitted from said jet nozzle.

2. A substrate processing method in which a substrate surface is dried by injecting it with dry gas containing a mixture of an organic solvent vapor and an inert gas,
the substrate processing method characterized in that the dry gas containing the mixture of inert gas and the organic solvent vapor is further diluted with dilution gas of the same kind of inert gas, wherein the mixed gas is formed by bubbling the inert gas in an organic solvent in a vapor generating unit,
wherein the temperature in the vapor generating unit is set at $T_1$,
the temperature of heated mixed gas is set at $T_2'$ from the vapor generating unit until the mixed gas is diluted with the dilution gas,
the temperature of heated dilution gas is set at $T_4$,
the temperature of the mixed gas containing the organic solvent and heated inert gas is set at $T_2''$ to the jet nozzle after the mixed gas is diluted with the dilution gas, and
the temperature of heated dry gas emitted from the jet nozzle is set at $T_3$,
and the temperatures are controlled such that the following relationship holds:
$T_1 \leq T_2' \leq T_4 \leq T_2'' \leq T_3 \leq$ boiling point of organic solvent, and
the organic solvent mist of submicron size is included in the dry gas emitted from the jet nozzle.

3. A substrate processing method according to claim 1 or claim 2, characterized in that the organic solvent is at least one kind selected from a group including isopropyl alcohol, diacetone alcohol, 1-methoxy-2-propanol, ethyl glycol, 1-propanol, 2-propanol, and tetrahydrofuran, and said inert gas is at least one kind selected from a group including nitrogen, argon, and helium.

4. A substrate processing apparatus including:
a vapor generating unit which generates a mixed gas of an organic solvent vapor and an inert gas by bubbling the inert gas in an organic solvent;
support means for supporting a plurality of substrates vertically arranged in parallel at equal pitches;
a rinsing processing vessel which accommodates the plurality of substrates supported by the support means;
a lid for covering the upper opening of said rinsing processing vessel;
jet nozzles which are provided in the lid; and
first piping which allows the vapor generating unit and the jet nozzles to communicate with each other, the substrate processing apparatus characterized in that the first piping and the jet nozzles are respectively equipped with heaters,
wherein the temperature in the vapor generating unit is set at $T_1$,
the temperature in the first piping is heated to $T_2$, and
the temperature in the jet nozzle is heated to $T_3$,
and the temperatures are controlled by the respective heaters such that the following relationship holds:
$T_1 \leq T_2 \leq T_3 \leq$ boiling point of organic solvent, and
the organic solvent mist of submicron size is part of the dry gas emitted from the jet nozzle.

5. A substrate processing apparatus including:
a vapor generating unit which generates a mixed gas of an organic solvent vapor and an inert gas by bubbling the inert gas in an organic solvent;
support means for supporting a plurality of substrates vertically arranged in parallel at equal pitches;
a rinsing processing vessel which accommodates the plurality of substrates supported by the support means;
a lid for covering the upper opening of said rinsing processing vessel;
jet nozzles which are provided in the lid; and
first piping which allows the vapor generating unit and the jet nozzles to communicate with each other,
the substrate processing apparatus characterized in that a second piping is provided and connected to the middle portion of the first piping for the purpose of supplying dilution gas of the same kind of inert gas,
the first piping, the second piping, and the jet nozzles are respectively equipped with heaters,
wherein the temperature in the vapor generating unit is set at $T_1$,
the temperature in the first piping is set at $T_2'$ from the vapor generating unit to the point in which it is connected with the second piping,
the temperature in the second piping is set at $T_4$,
the temperature in the first piping is set at $T_2''$ from the point in which it is connected with the second piping to the nozzle, and
the temperature in the jet nozzle is set at $T_3$,
and the temperatures are controlled by the respective heaters such that the following relationship holds:
$T_1 \leq T_2' \leq T_4 \leq T_2'' \leq T_3 \leq$ boiling point of organic solvent, and
the organic solvent mist of submicron size is part of the dry gas emitted from said jet nozzle.

6. A substrate processing apparatus according to claim 5, characterized in that a static mixer is provided downstream from the point of connection between the first piping and the second piping and upstream in respect of the jet nozzle.

7. A substrate processing apparatus described in any one of claims 4 to 6, characterized in that the organic solvent is at least one kind selected from a group including isopropyl alcohol, diacetone alcohol, 1-methoxy-2-propanol, ethyl glycol, 1-propanol, 2-propanol, and tetrahydrofuran, and said inert gas is at least one kind selected from a group including nitrogen, argon, and helium.

* * * * *